United States Patent [19]

Sugawara

[11] Patent Number: 4,968,636
[45] Date of Patent: Nov. 6, 1990

[54] EMBEDDED ISOLATION REGION AND PROCESS FOR FORMING THE SAME ON SILICON SUBSTRATE

[75] Inventor: Fumio Sugawara, Tokyo, Japan
[73] Assignee: Oki Electric Industry Co., Ltd., Tokyo, Japan
[21] Appl. No.: 407,449
[22] Filed: Sep. 14, 1989
[30] Foreign Application Priority Data

Sep. 14, 1988 [JP] Japan .................. 63-231133

[51] Int. Cl.$^5$ ............................. H01L 21/76
[52] U.S. Cl. .......................... 437/24; 437/26; 437/61
[58] Field of Search ................ 437/24, 26, 61

[56] References Cited

U.S. PATENT DOCUMENTS

| | | | |
|---|---|---|---|
| 3,622,382 | 11/1971 | Brack et al. | 437/26 |
| 3,976,511 | 8/1976 | Johnson | 437/26 |
| 4,800,170 | 1/1989 | Jain et al. | 437/24 |

FOREIGN PATENT DOCUMENTS

| | | | |
|---|---|---|---|
| 0059090 | 5/1979 | Japan | 437/24 |
| 0156490 | 12/1979 | Japan | 437/26 |
| 0037645 | 4/1981 | Japan | 437/24 |
| 0142541 | 8/1983 | Japan | 437/26 |
| 0027521 | 2/1984 | Japan | 437/26 |

OTHER PUBLICATIONS

A New Trench Isolation Technique for MOS VLSI, Toshiyuki Ishijima and Kazuo Terada.

Primary Examiner—Olik Chaudhuri
Assistant Examiner—Ourmazd S. Ojan
Attorney, Agent, or Firm—Wenderoth, Lind & Ponack

[57] ABSTRACT

An embedded isolation region and a process for forming the same on the substrate made of silicon. The isolation region(s) is constituted of a silicon nitride region, a silicon oxide region and, if required, a channel stop region in this order in the upper surface of the substrate to the deep inside of the substrate. The isolation region(s) is formed by an ion implantation technique using a mask made of an oxide film, followed by oxidation and removal of at least an upper substrate region on the upper side of the silicon nitride region. As compared with the formation of a conventional trench type region(s), even isolation regions with different sizes or an isolation region having portions with different sizes can be formed without a fear of entailing an uneven surface, and the development of crystal defects can be mitigated without an increase in the number of steps, while, even in a trench filled with poly-Si, at the same time some adverse effect of the remaining poly-Si on element regions can be avoided.

14 Claims, 9 Drawing Sheets

FIG_1(d)
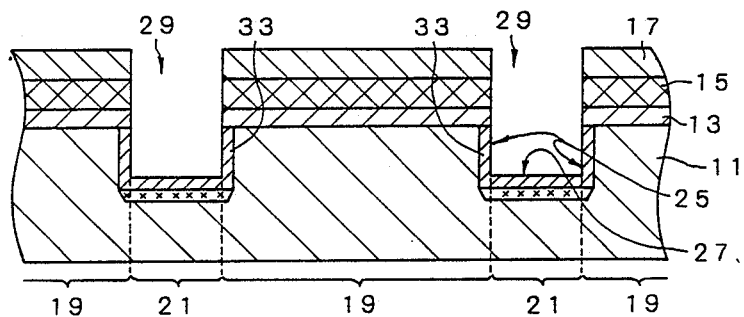
FIG_1(e)
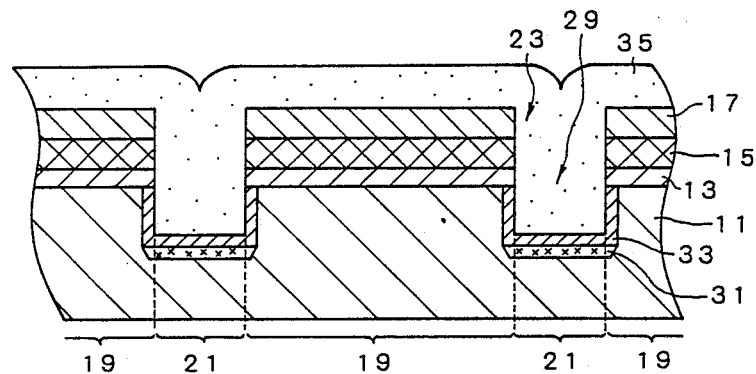
FIG_1(f)
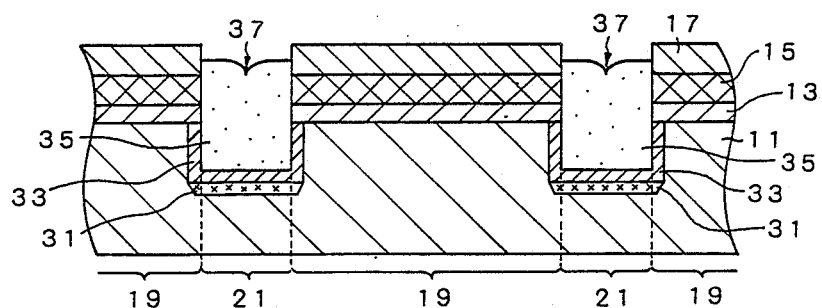

FIG_2(a)
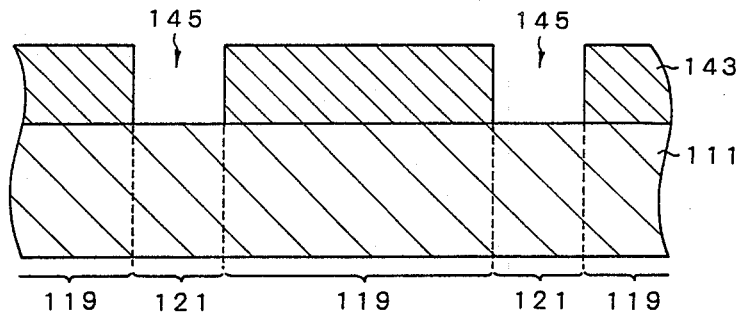
FIG_2(b)
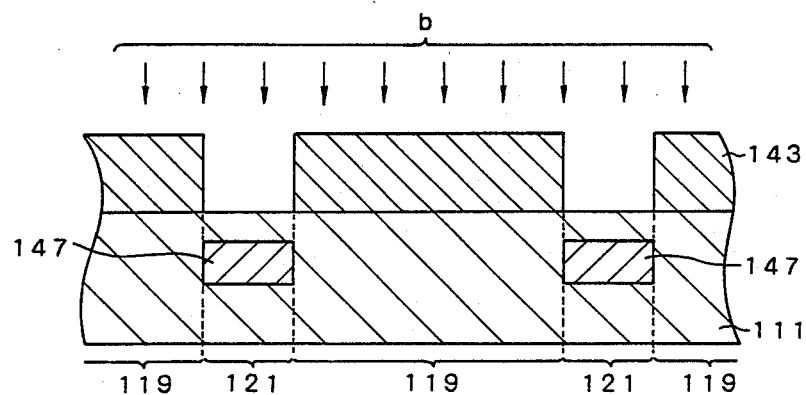

FIG_2(c)
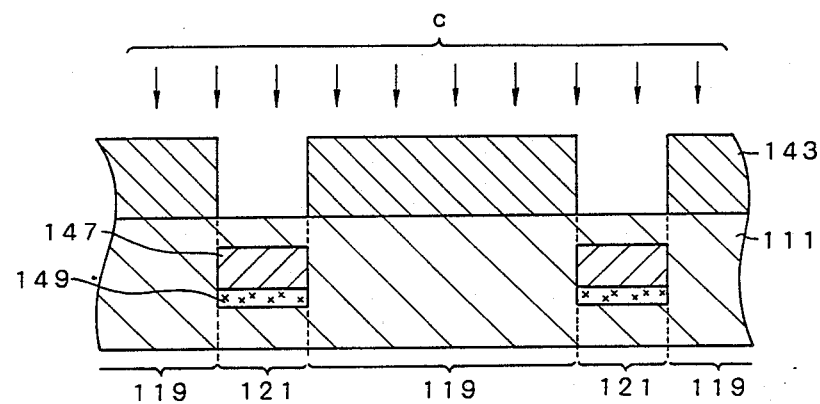
FIG_2(d)
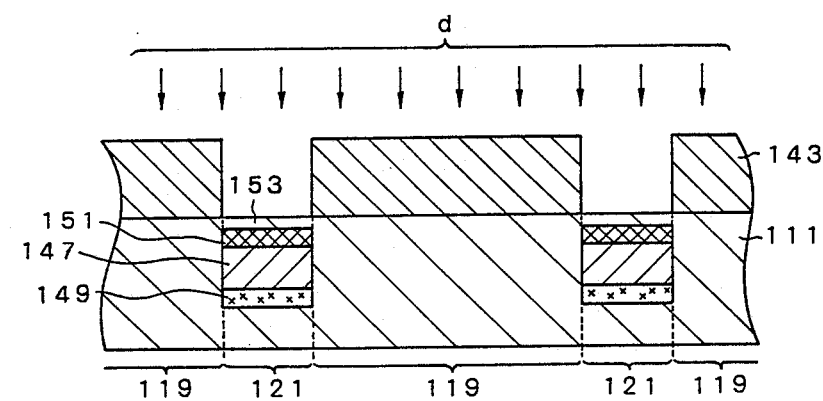

FIG_2(e)
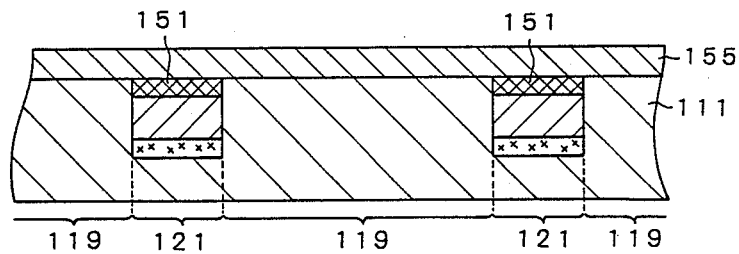
FIG_2(f)
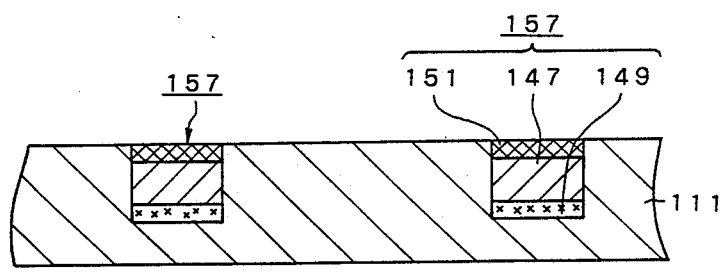

FIG_3(a)
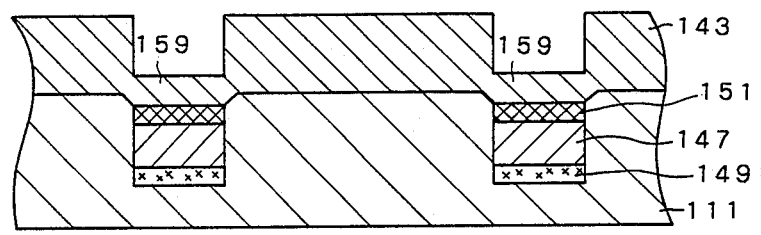
FIG_3(b)
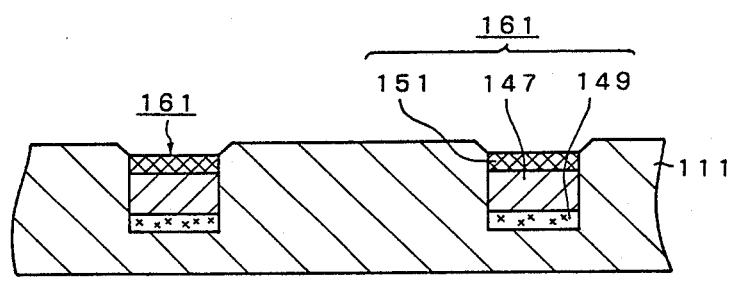

FIG_4
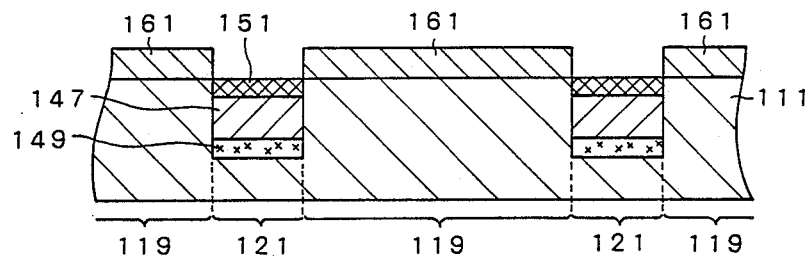
FIG_5
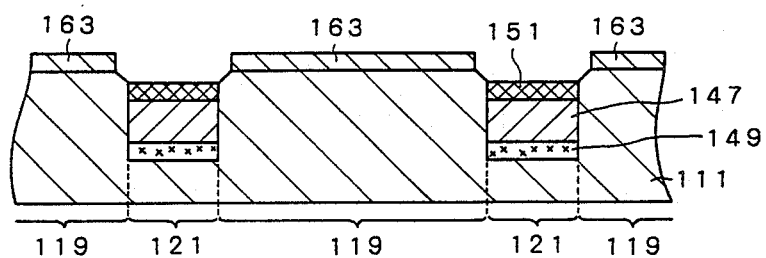

EMBEDDED ISOLATION REGION AND PROCESS FOR FORMING THE SAME ON SILICON SUBSTRATE

BACKGROUND OF THE INVENTION

1. Field of the Invention

The present invention relates to an element isolation technique suitably applicable to the production of various semiconductor devices.

2. Prior Art

With a trend to miniaturization and speedup of various electronic appliances, various production-related techniques have been developed with a view to attaining higher-density integration of semiconductor devices (hereinafter often referred to simply as "devices") constituting electronic appliances as mentioned above.

As one of the above-mentioned conventional production-related techniques, there is known a technique of forming an isolation region(s) on a substrate, which include a widely-used selective oxidation (LOCOS: local oxidation of silicon) method in which only the isolation region(s) of a silicon substrate is selectively oxidized using silicon nitride ($Si_XN_Y$, wherein X and Y are each a positive number) as an oxidation-resistant mask. Additionally stated, in the following description, an "isolation region" as a constituent part is distinguished in usage of term from a "field region" as a kind of site of a substrate predetermined in accordance with the designing there of.

As is well known, so-called bird's breaks sometimes appear in the case of the LOCOS method. This entails an increase in the area of a field region in comparison with the area of an active region based on the designing of a device, according to an isolation technique using the LOCOS method.

Further, in the LOCOS method, decreases in the sizes of the field region and the active region or a decrease in the size of any one of the above-mentioned two regions brings about various disadvantages such as a narrow channel effect of increasing the threshold value $V_T$ of a transistor and a poor threshold value of an inactive transistor.

Thus, the fact is that the LOCOS method cannot cope with the miniaturization and high-density integration of devices.

A known isolation technique alternative to the LOCOS method is disclosed in, for example, Literature I: "1984 Symposium on VLSI Technology," pp. 28–29, 1984. This technique is called a "trench isolation method."

An example of the above-mentioned conventional trench isolation method will now be described while referring to the accompanying drawings.

FIGS. 1(a) to 1(h) are schematic cross-sectional views of structures produced in major steps of a process, which are illustrative of a conventional technique using the trench isolation method.

First, a pad oxide film 13 made of silicon oxide ($SiO_Z$ wherein Z is a positive number) and having a thickness of about 400 Å is formed on the upper surface of a substrate 11 by, for example, a chemical vapor deposition (CVD) method or a thermal oxidation treatment. Thereafter, an oxidation-resistant film 15, made of silicon nitride ($Si_XN_Y$) and having a thickness of about 1,600 Å, and a mask film 17 for use in formation of a trench, made of silicon oxide ($SiO_Z$) and having a thickness of about 2,000 Å, are sequentially deposited on the pad oxide film 13 by, for example, a CVD method to obtain a structure as shown in FIG. 1(a).

Subsequently, a resist pattern (not shown in the figures) is provided on the upper surface areas of the above-mentioned structure corresponding to active regions 19 of the substrate 11. Thereafter, the mask film 17 for use in the formation of the trench, the oxidation-resistant film 15 and the pad oxide film 13 are sequentially removed only from an area thereof located on a field region 21 of the substrate 11 by etching with the resist pattern serving as an etching mask according to an anisotropic etching technique such as a reactive ion etching (RIE) method.

According to the foregoing procedure, an opening 23, partially exposing the upper surface of the substrate 11 and having side face extending vertically along the above-mentioned three layers 13, 15 and 17 up to the level of the upper surface of the substrate 11, is formed as shown in FIG. 1(b).

Subsequently, a trench 29, having a side face 25 perpendicular to the upper surface of the substrate 11 and a bottom face 27 parallel therewith, is formed by the above-mentioned RIE method while utilizing as an etching mask the three layers 13, 15 and 17 remaining on the active regions 19.

Thereafter, the above-mentioned three layers 13, 15 and 17 remaining on the active regions 19 are used as a mask for ion implantation to effect the ion implantation (indicated by a range of arrows a in FIG. 1(c) of a p-type impurity such as boron ions ($B^+$) through the above-mentioned trench 29 to thereby form a channel stop region 31 as shown in FIG. 1(c).

Subsequently, the resulting structure having the formed trench 29 is subjected to a thermal oxidation treatment to form an inner surface oxide film 33 as shown in FIG. 1(d) in an inner surface portion along the side face 25 and the bottom face 27 of the above-mentioned trench 29.

Subsequently, a polycrystalline silicon (poly-Si) film 35 is deposited on the whole upper surface of the structure as shown in FIG. 1(d). The deposition of the poly-Si film 35 is done to such an extent as to fill up the aforementioned trench 29 and the opening 23 with the poly-Si film 35 as well as cover the upper surface of the above-mentioned structure with the poly-Si film 35. Thus, a structure as shown in FIG. 1(e) is obtained.

Subsequently, the above-mentioned poly-Si film 35 is etched to form a substantially planar surface 37 while leaving part of the poly-Si film 35 still at least completely filling therewith the above-mentioned trench 29 (see FIG. 1(f)).

The formation of the substantially planar surface 37 can be effected through an etching back treatment using one of various dry etching techniques or a wet etching technique wherein a hydrofluoric acid type etchant is used.

Thereafter, the mask film 17 for use in the formation of the trench which constitutes part of the surface portion of the structure at this stage is removed by etching. As a result, the poly-Si film 35 (having the substantially planar surface 37) remains on the field region 21, while the oxidation-resistant films 15 on the active regions 19 are exposed. The resulting structure is subjected to a thermal oxidation treatment to oxidize a top portion of the poly-Si film 35 to thereby form a top oxide film 39 having a thickness of about 3,000 Å as shown in FIG.

1(g). This top oxide film 39 is integrated with the pad oxide film 13 and the inner surface oxide film 33.

Subsequently, the above-mentioned oxidation-resistant film 15 and the pad oxide film 13 are sequentially removed by etching to expose the upper surface of the substrate 11 in the active regions 19 while forming an isolation region 41 constituted of the remaining oxide film 39 and poly-Si film 35 in the field region 21 (see FIG. 1(h)).

As will be understandable from the foregoing description, the isolation region 41 is formed through the thermal oxidation treatments after the formation of the channel stop region 31. Even if the channel stop region 31 expands laterally (in a direction parallel with the upper surface of the substrate) as well as in the depthwise direction of the substrate because of diffusion of implanted ions caused by the latter one of the abovementioned thermal oxidation treatments, the adverse effect of the expansion of the channel stop region 31 on the source/drain regions of a device can be avoided because the channel stop region 31 is formed considerably apart from the source/drain regions, etc. Such a construction of a trench type isolation region(s) is effective in decreasing the widths of active regions in step with the higher-density integration of devices to be able to cope with a decrease in the dielectric strength due to the punch through effect, an increase in the narrow channel effect, etc.

Further, according to the foregoing technique, a volume expansion accompanies the growth of the oxide films from silicon because the isolation region 41 is formed through the thermal oxidation treatment of the poly-Si films 35. This volume expansion creates some stress, for example, in portions corresponding to the corners of the trench 29 to expand the above-mentioned portions in directions parallel with the upper surface of the substrate 11. The above-mentioned stress works to develop crystal defects in the proximity of the above-mentioned corners. Such crystal defects sometimes cause occurrence of electric current leaks in various types of devices, deterioration of the dielectric strength of gate oxide film, etc.

As one conventional method for mitigating the development of such crystal defects, there is a method wherein an isotropic etching treatment to form an undercut is effected before an anisotropic etching treatment in preparation for the formation of a trench as shown in FIGS. 1(b) and 1(c). According to this method, a trench (not shown in the figures) having an inner face obtusely angled with the upper surface of a substrate is formed to decrease the influence of the stress caused by the aforementioned growth of oxide films to thereby mitigate the development of crystal defects.

Further, crystal defects as mentioned above are also developed during the formation of the inner surface oxide film 33 as illustrated by reference to FIG. 1(d). As a countermeasure against this, the once-formed inner surface oxide film is removed by etching to eliminate the stress, followed by forming an inner surface oxide film again, whereby the development of crystal defects is mitigated.

The above-mentioned two types of treatments for the purpose of obviating the development of crystal defects (hereinafter referred to as "rounding treatments") can mitigate the occurrence of electric current leaks, the deterioration of the dielectric strength of gate oxide films, etc.

However, the foregoing conventional method of forming an embedded isolation region involves the following various problems.

(1) Where isolation regions with different widths or portions of an isolation region with different widths are required to be simultaneously formed on one substrate according to the design of a semiconductor device, a narrow trench or a narrow portion of a trench, and a wide trench or a wide portion of a trench are easy and hard, respectively, of being filled up with poly-Si in the step of filling the trench(es) with poly-Si. Therefore, it is difficult to control the thicknesses of poly-Si films or portions of a poly-Si film with which the trenches with the different widths or the portions of the trench with the different widths are to be simultaneously filled up. In such a case, even if a sufficiently thick poly-Si film(s) is deposited and etched back, the thickness of the poly-Si films or the portions of the poly-Si film embedded in the trench(es) are not equal with each other. Thus, simultaneous formation of element isolation regions with different widths or portions of an isolation portion with different widths on one substrate involves a problem of forming a complex uneven surface of the resulting structure.

(2) Where the aforementioned rounding treatment is effected for the purpose of mitigating the development of crystal defects caused by oxide film growth, there arises a problem that the yield may lower to the accompaniment of an increase in the number of steps.

(3) The aforementioned isolation region is formed by thermal oxidation of a poly-Si film embedded in a trench. When the trench is formed so as to have a sufficient depth, poly-Si remains on the inside of the isolation region. Therefore, the poly-Si film 15 surrounded by the inner oxide film 33 and the top oxide film 39 (see FIGS. 1(g) and 1(h)) is left in a floating state to present a problem that the resulting semiconductor device is in electrically unstable condition.

(4) The aforementioned isolation region is obtained in a state of the top oxide film 39 thereof being exposed to the outside of the substrate 11. In general, silicon oxide constituting the top oxide film 39 and silicon constituting the substrate 11 have mutual selectivities in respective etching treatments. This entails a problem of forming a different in level between the upper surface of the isolation region and the upper surfaces of the substrate corresponding to element regions.

In view of the foregoing various problems, an object of the present invention is to provide a process for forming an embedded isolation region(s) which can realize simplification of the process, higher-density integration of a device, an improvement in the reliability of the device, etc.

SUMMARY OF THE INVENTION

The above-mentioned object can be attained according to the present invention.

In one aspect of the present invention, there is provided a process for forming an isolation region(s) on a substrate made of silicon, which comprises the steps of:

(A) forming on a substrate a mask made of a first oxide film and having an opening(s) partially exposing the upper surface of the substrate;

(B) implanting oxygen ions into the substrate by utilizing the mask, and thereafter heat-treating the resulting structure to form a silicon oxide region(s) inside the substrate;

(C) implanting nitrogen ion into the substrate by utilizing the mask to form a silicon nitride region(s) adjoining the upper face(s) of the silicon oxide region(s) facing the upper surface of the substrate;

(D) removing the mask; and (E) thermally oxidizing an upper substrate region(s) on the upper side of the silicon nitride region(s) to convert the upper substrate region(s) into an oxide film(s) as a second oxide film(s), and thereafter removing the second oxide film(s) positioned on the upper side of the silicon nitride region(s).

In another aspect of the present invention, there is provided a process for forming an isolation region(s) on a substrate made of silicon, which comprises the steps of:

(A) forming on a substrate a mask made of a first oxide film and having an opening(s) partially exposing the upper surface of the substrate;

(B) implanting oxygen ions into the substrate by utilizing the mask, and thereafter heat-treating the resulting structure to form a silicon oxide region(s) inside the substrate;

(C) implanting boron ions or phosphorus ions into the substrate by utilizing the mask to form a channel stop region(s) adjoining the under face(s) of the silicon oxide region(s);

(D) implanting nitrogen ions into the substrate by utilizing the mask to form a silicon nitride region(s) adjoining the upper face(s) of the silicon oxide region(s) facing the upper surface of the substrate;

(E) removing the mask; and (F) thermally oxidizing an upper substrate region(s) on the upper side of the silicon nitride region(s) to convert the upper substrate region(s) into an oxide film(s) as a second oxide film(s), and thereafter removing the second oxide film(s) positioned on the upper side of the silicon nitride region(s).

In still another aspect of the present invention, there is provided an isolation region embedded in a substrate made of silicon, which comprises a two-layer structure consisting of a silicon oxide region provided on the inside of the substrate, and a silicon nitride region provided on the upper side of the silicon oxide region and having a face exposed to the outside of the substrate and opposite to the face thereof adjoining the upper face of the silicon oxide region.

In a further aspect of the present invention, there is provided an isolation region embedded in a substrate made of silicon, which comprises a three-layer structure consisting of a silicon oxide region provided on the inside of the substrate, a channel stop region provided on the inside of the substrate and on the lower side of the silicon oxide region, and a silicon nitride region provided on the upper side of the silicon oxide region and having a face exposed to the outside of the substrate and opposite to the face thereof adjoining the upper face of the silicon oxide region.

According to the process of the present invention for forming an isolation region(s), an isolation region constituted of a silicon nitride region, a silicon oxide region and, if required, a channel stop region in this order in a direction oriented from the upper surface of a substrate to the deep inside of the substrate is formed by an ion implantation technique using a mask made of an oxide film or a mask made of the oxide film and a resist, followed by oxidation and removal of at least an upper substrate region on the upper side of the above-mentioned silicon nitride region.

Since the formation of an isolation region(s) according to the present invention is thus effected by the ion implantation technique instead of the conventional technique comprising forming a trench and filling up the trench with poly-Si, even isolation regions with different sizes or an isolation region having portions with different sizes can be formed without a fear of entailing an uneven surface, and the development of crystal defects can be mitigated without an increase in the number of steps, while at the same time some adverse effect of the remaining poly-Si on element regions can be avoided.

Further, since an isolation region is formed through oxidation of an upper substrate region positioned on the upper side of the silicon nitride region and subsequent removal of the resulting oxide film at least right on the upper side of the silicon nitride region, a portion of the isolation region having a surface exposed to the outside of the substrate is constituted of oxidation-resistant silicon nitride. This reduces a possibility of giving rise to a new difference(s) in level between the upper surface of the isolation region and the upper surfaces of element regions after the formation of the isolation region.

BRIEF DESCRIPTION OF THE DRAWINGS

The foregoing and other objects and advantages of the present invention will be better understood by references to the following description, taken in connection with the accompanying drawings, in which:

FIGS. 1(a) to 1(h) are schematic partial cross-sectional views of structure produced in respective major step of a process, which are illustrative of a conventional technique;

FIGS. 2(a) to 2(f) are schematic partial cross-sectional views of structures produced in respective major steps of a process, which are illustrative of a preferable example of the present invention;

FIGS. 3(a) and 3(b) are schematic partial cross-sectional view of structures produced in respective key steps of a process, which are illustrative of another example of the present invention;

FIGS. 4 and 5 are schematic partial cross-sectional views of structures, which are respectively illustrative of other examples of the present invention.

DETAILED DESCRIPTION OF PREFERRED EMBODIMENTS

Figure 1A:
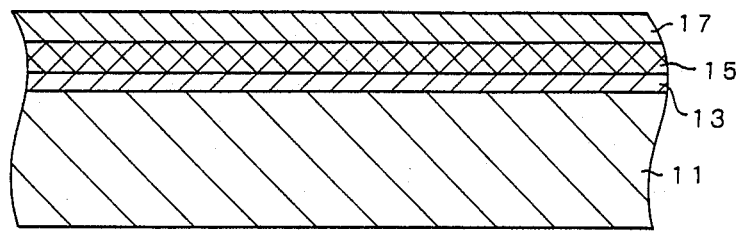
Figure 1B:
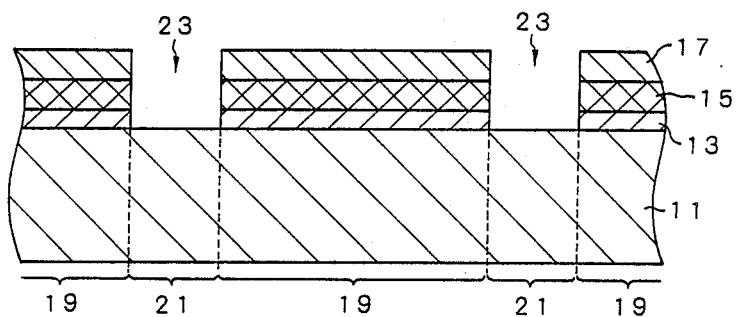
Figure 1C:
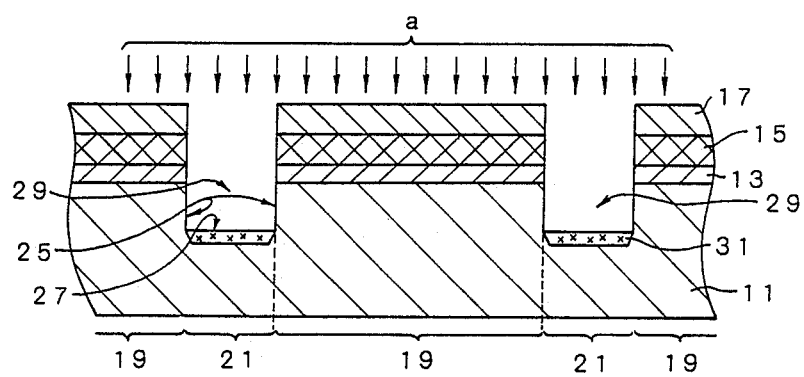
Figure 1G:
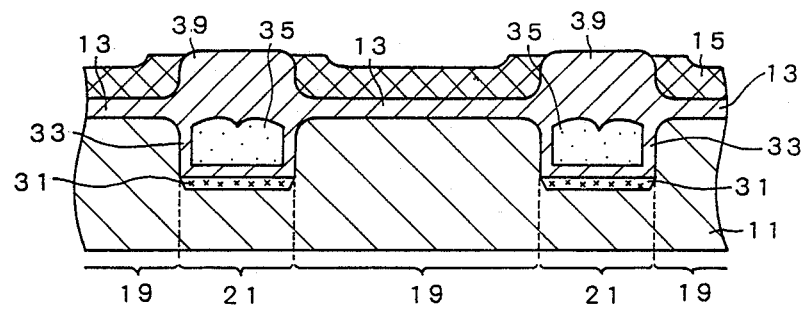
Figure 1H:
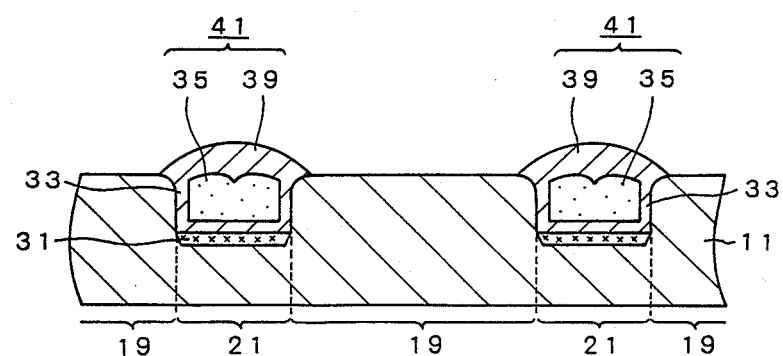

Preferred examples of the present invention will now be described while referring to the accompanying drawings. Additionally stated, the drawings referred to in the following description shows the shapes, sizes, positional relationships, etc. of constituent parts only so schematically as to make the present invention understandable. Therefore, the scope of present invention should be construed as being not limited only by the examples as shown in the drawings.

Further, although specific conditions are exemplified in the following examples in order to facilitate the understanding of the following description, the scope of the present invention should be construed as being not limited only to such exemplified specified conditions.

FIGS. 2(a) to 2(f) are schematic partial cross-sectional views of structures produced in respective major step of a process, which are illustrative of an example of the present invention. Where a plurality of constituent parts having the same function are shown in a figure, a numeral is sometimes affixed to one of some of the constituent parts.

First, an oxide film having a thickness of about 9,000 Å is formed on the upper surface of a substrate 111 made of p-type single crystal silicon and having a crystal face (100), for example, through a CVD method or a thermal oxidation treatment. Thereafter, a resist pattern not shown in the figures is formed, followed by removing a portion of the oxide film positioned right on the field region 121 of the substrate 111 by an RIE method or other anisotropic etching method to thereby form a mask 143 made of the oxide film having an opening 145 exposing part of the upper surface of the substrate 111 corresponding to the field region 21 while leaving the oxide film 143 on the active regions 119 of the substrate 111 (see FIG. 2(a)). The above-mentioned oxide film for use in the formation of the mask 143 is referred to as a "first oxide film."

Subsequently, as shown in FIG. 2(b), oxygen ions as indicated by arrows b in the figure are implanted into the substrate 111 at an areal density of $2.2 \times 10^{18}$ ions/cm$^2$ with an acceleration energy of 150 KeV while utilizing the above-mentioned mask 143.

Thereafter, the resulting structure is heat-treated in an non-oxidizing atmosphere of, for example, nitrogen (N$_2$) at a temperature of about 1,150 °C. for 2 hours to form a silicon oxide region 147 in an internal portion of the substrate 111 corresponding to the aforementioned field region 121.

Additionally stated, the foregoing technique of forming a silicon oxide region inside a substrate by ion implantation of oxygen ions and a subsequent heat treatment is disclosed in Literature II: "Proceeding 11th Symposium on Ion Source and Ion-Assisted Technology '87 Tokyo," pp. 625–628, 1987. According to this literature, ion implantation of oxygen ions into a single crystal silicon substrate under substantially the same conditions as mentioned above and a subsequent heat treatment can form a silicon oxide region ranging from about 5,000 Å to about 1,000 Å in depth from the upper surface of the substrate and having a thickness of about 4,000 Å, while leaving the single crystal silicon with little damage thereto up to a depth of about 1,000 Å from the upper surface of the substrate.

Subsequently, boron ions as indicated by arrows c in FIG. 2(c) are implanted into the substrate 111 at an areal density of $3.0 \times 10^{13}$ ions/cm$^2$ with an acceleration energy of 200 KeV while utilizing the aforementioned mask 143 made of the oxide film, like in the formation of the aforementioned silicon oxide region 147, to thereby form a channel stop region 149 in a range of the substrate 111 located on the lower side of the silicon oxide region 147 and adjoining the silicon oxide region 147 (see FIG. 2(c)). In passing, in the case of producing a CMOS transistor, a combination of an oxide film as mentioned above and a resist is used, as a mask for ion implantation, instead of the above-mentioned mask 143 made of the oxide film alone.

Subsequently, nitrogen ions as indicated by arrows d in FIG. 2(d) are implanted into the substrate 111 at an areal density of $2.0 \times 10^{17}$ ions/cm$^2$ with an acceleration energy of 40 KeV while utilizing the mask 143 to thereby form a silicon nitride region 151 in a range of the substrate 111 located on the upper side of the silicon oxide range 147 and adjoining the silicon oxide region 147. Thus, a structure as shown in FIG. 1(d) is obtained.

Since the silicon nitride region 151, the silicon oxide region 147 and the channel stop region 149 are formed in a state of adjoining each other in this order in a vertical direction in the steps of forming these regions according to ion implantation, the development of a floating state, which has heretofore been problematic, can be avoided in the present invention.

A detailed description will now be made of the silicon oxide region 147, the channel stop region 149 and the silicon nitride region 151 formed by the foregoing ion implantation.

As will be understandable from the foregoing description, the ion implantation of oxygen ions, boron ions and nitrogen ions to form the above-mentioned regions are effected under respective specified conditions in this example.

The regions made of silicides formed through respective reactions between such ions and single crystal silicon constituting the substrate 111 are two types of regions, namely the silicon oxide regions 147 and the silicon nitride regions 151. In order to form the silicon oxide region 147 of the two types of regions, the ion implantation of oxygen ions must be followed by the heat treatment. In contrast, in the case of the silicon nitride region 151, no particular heat treatment for formation of the silicon nitride region 151 is necessary because silicon nitride is formed only through ion implantation of nitrogen ions into silicon.

Accordingly, mutual diffusion of ions through those regions can be suppressed by forming the channel stop region 149 and the silicon nitride region 151, not required to go through any heat treatments for the formation thereof, after the formation of the silicon oxide region 147 through a heat treatment, for example, at a high temperature of about 1,200 °C., because any subsequent heat treatments are made at a low temperature.

Additionally stated, either the silicon nitride region 151 or the channel stop region 149 may be formed first.

A description will now be made of the formation of the silicon nitride region 151.

According to the process of the present invention, the conditions of ion implantation to form the oxidation-resistant silicon nitride region 151 are so appropriately chosen as to implant nitrogen ions in a predetermined range of depth. However, silicon is difficult to convert into nitride stable against oxidation in the whole depth range extending from the upper side (depth: about 1,000 Å) of the silicon oxide region 147 to the upper surface of the substrate 111.

This will be further described. When silicon nitride is represented by the formula: Si$_X$N$_Y$, silicon present in a range extending from the above-mentioned upper side of the silicon oxide region 147 to a depth of about 300 Å from the upper surface of the substrate 111 is converted into silicon nitride having a composition close to Si$_3$N$_4$ and a capability of exhibiting a stable oxidation resistance through nitrogen ion implantation under the conditions used in aforementioned example. Additionally stated, in FIG. 2(d), only such a region capable of exhibiting a stable oxidation resistance is shown as the silicon nitride region 151 in order to facilitate the understanding of the description.

However, an upper substrate region 153 as shown in FIG. 2(d) which ranges from the above-mentioned depth of about 300 Å to the upper surface of the substrate 111 are so small in amount of nitrogen (ions) implanted thereinto that the coefficient X representing the amount of silicon is higher than the coefficient Y representing the amount of nitrogen. Thus, the upper substrate region 153 is low in oxidation resistance.

In view of this, according to the present invention, the step of FIG. 2(d) is followed by removal of the mask 143 and a subsequent thermal oxidation treatment of a whole upper surface portion of the substrate 111. This thermal oxidation treatment works to convert the upper substrate region 153 located on the upper side of the silicon nitride region 151 into an oxide film 155 as shown in FIG. 2(e). As a result, the oxide film 155 substantially made of silicon oxide is formed on the upper side of the substrate 111 covering both the field region 121 and the active regions 119.

Subsequently, the above-mentioned oxide film 155 formed on the upper surface of the substrate 11 is removed by etching to expose the surfaces of the silicon nitride region 151 and the substrate 111 to thereby secure an isolation region 157 as shown in FIG. 2(f). The embedded isolation region 157 formed according to the foregoing procedure has a three-layer structure consisting of the silicon nitride region 151 exposed to the outside of the substrate 111, the silicon oxide region 147, and the channel stop region 149.

Additionally stated, the removal of the above-mentioned oxide film 155 and the aforementioned oxide film 143 as the mask can be effected either using a conventional etchant of hydrofluoric acid type or according to a dry etching technique. The terminal of the etching is easy to detect because silicon nitride and silicon are present on the lower side of the oxide film 155. Further, where the isolation region provided by the foregoing procedure are utilized to produce, for example, MOS type field-effect transistors, only the portion of the oxide film 155 corresponding to the field region 121 may be removed by etching while leaving, in the active regions 119, the oxide film 155 only in a predetermined thickness. The remaining oxide films 161 may be utilized as gate oxide films (see FIG. 4).

Next, another example will be described while referring to FIGS. 3(a) and 3(b).

In this example, after the procedure as illustrated by reference to FIGS. 2(a) to 2(d) to form a silicon oxide region 147, a channel stop region 149 and a silicon nitride region 151, a thermal oxidation treatment is effected while leaving a mask 143, to form an oxide film 159 in an exposed portion of a substrate 111 corresponding to the opening of the mask 143 as a first step for eliminating an upper substrate region 153 as mentioned before (see FIG. 3(a)).

Subsequently, the same etching treatment as illustrated by reference to FIGS. 2(e) and 2(f) is effected to simultaneously remove the oxide film 159 and the mask 143 to thereby secure an isolation region 161 having a three-layer structure as shown in FIG. 3(b).

As will be understandable from the foregoing description, growth of an oxide film in upper surface portions of a substrate 111 located right on the lower side of the mask 143 made of the oxide film does not substantially occur according to the procedure of this example described by reference to FIGS. 3(a) and 3(b). Accordingly, a difference in level appears between the upper surface of the isolation region 161 and the upper surface of the substrate 111 as shown in FIG. 3(b). However, discontinuity of any thin film, which is necessary for formation of a semiconductor element, deposited in a step after the formation of the isolation region is little liable to occur because the above-mentioned difference in level appears in the form of a gentle slope by virtue of diffusion of oxygen causing the progress of growth of the oxide film.

Just like in the previous example, the oxide film 159 and part of the mask 143 in the thickness-wise direction thereof may be removed by etching in the step of removing the oxide film to secure the isolation region, while leaving the other parts of the mask 143. The remaining oxide films 143 of the mask may be utilized as gate oxide films (FIG. 5).

While a description in the foregoing examples has been made of the embedded isolation regions comprising a three-layer structure consisting of a silicon nitride region, a silicon oxide region and a channel stop region, the isolation region of the present invention may also comprise an embedded two-layer structure consisting of a nitride region and a silicon oxide region without a channel stop region.

Figure 6A:
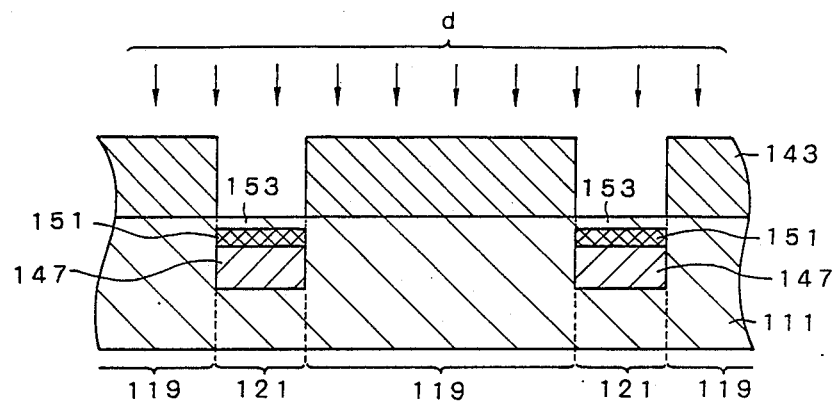
FIGS. 6(a) to 6(c) are schematic partial cross-sectional views of structures produced in respective key steps of a process, which are illustrative of still another example of the present invention.
Figure 6B:
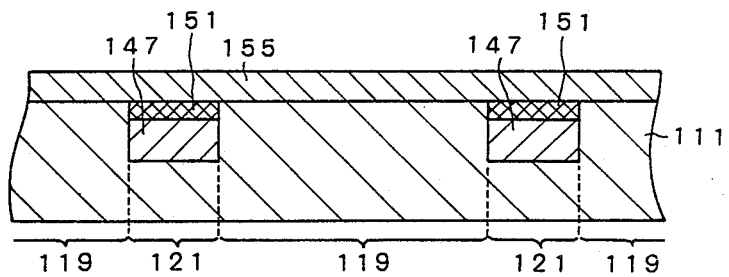
Figure 6C:
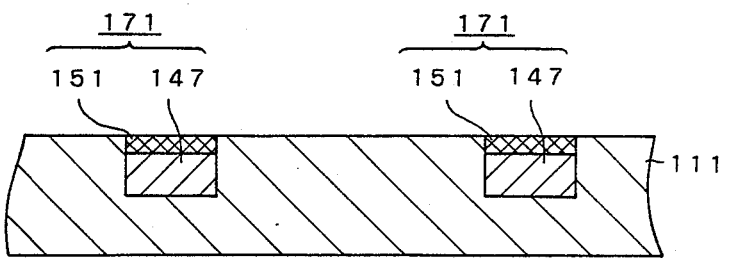

FIGS. 6(a) to 6(c) are schematic partial cross-sectional views of structures produced in respective key steps of a process, which are illustrative of the process for forming an isolation region comprising a two-layer structure according to the present invention. A description by reference to FIGS. 6(a) to 6(c) will be made particularly of differences of the above-mentioned process from the already-described process for forming an isolation region comprising a three-layer structure with omitting the explanations of the former process in common with those of the latter, while dispensing with drawing figures relating to the steps of the former in common with those of the latter.

In the case of the process for forming an isolation region comprising a two-layer structure as well, a silicon oxide region 147 is formed inside a substrate 111 under the same conditions as in the formation of the isolation region comprising a three-layer structure through the steps as shown in FIGS. 2(a) and 2(b). Thereafter, nitrogen ions as indicated by arrows d in FIG. 6(a) are implanted into the substrate 111 to form a silicon nitride region 151 in an internal portion of the substrate 111 located on the upper side of the silicon oxide region 147. The same condition as in the formation of the silicon nitride region of the isolation region comprising the three-layer structure as shown in FIG. 2(d) may be used as conditions under which the silicon nitride region 151 as shown in FIG. 6(a) is formed.

Thereafter, removal of a mask 143 in the same manner as in the formation of the isolation region comprising the three-layer structure is followed by a thermal oxidation treatment of the upper substrate region located on the upper side of the silicon nitride region 151 to convert the same into an oxide film 155, which will be referred to as a "second oxide film" (see FIG. 6(b)). Thereafter, the second oxide film 155 is removed to expose the upper face of the silicon nitride region 151 to the outside of the substrate 111 to thereby secure an isolation region 171 comprising a two-layer structure as shown in FIG. 6(c).

As described above, since the isolation region 171 comprising the two-layer structure is different from the isolation region comprising the three-layer structure only in that a channel stop region is dispensed with in the former, the various steps of the process except for the step of forming a channel stop region may be performed under the same condition as in the formation of the isolation region comprising the three-layer structure. Accordingly, the formation of an isolation region comprising a two-layer structure can be done according to any one of substantially the same examples of the process of the present invention as in the formation of an isolation region comprising a three-layer structure according to the present invention, for example, as respectively illustrated in FIGS. 3(a) and 3(b), FIG. 4, and FIG. 5. In such a case, replacement of an isolation region comprising a three-layer structure with an isolation region comprising a two-layer structure constituted of a silicon oxide region 147 and a silicon nitride region 151 without a channel stop region 149 will suffice in looking at FIGS. 3(a) and 3(b), FIG. 4 or FIG. 5.

While the various examples of the process of the present invention have been described, it will be obvious to those skilled in the art that the scope of the present invention is not limited to the above-mentioned examples.

For example, when an n-type silicon substrate is used instead of aforementioned p-type substrate in carrying out the process of the present invention, substantially the same effects as in the foregoing aforementioned examples can be secured. Additionally stated, in the case of using an n-type silicon substrate, it is preferable to form a channel stop region through phosphorous (P) ion implantation.

In the foregoing examples, the procedure of ion implantation to form the silicon oxide region, the silicon nitride region and the channel stop region, if necessary, has been described with the exemplification of the specified acceleration energies and areal densities (densities per unit area) as the conditions of ion implantation. However, those numerical conditions are merely mentioned as preferred instances. Further, the depth of the above-mentioned three kinds of regions as well as the sizes thereof in the depth-wise direction are capable of various modifications in accordance with the designing of semiconductor devices.

It will be obvious to those skilled in the art that materials, sizes, shapes, numerical conditions, positional relationships, and other conditions are all capable of change or alternation within the purview of the object of the present invention in accordance with arbitrary suitable designing.

As will be apparent from the foregoing description, according to the structure of the isolation region of the present invention and the process of the present invention for forming the same, the formation by ion implantation of an isolation region constituted of a silicon nitride region, a silicon oxide region and a channel stop region, if necessary, is followed by oxidation of at least an upper substrate region located on the upper side of the above-mentioned silicon nitride region to once from an oxide film, and subsequent removal of the oxide film present on the upper surface of remaining non-oxidized substrate Thus, the formation of an isolation region(s) by ion implantation can keep from the formation of an uneven upper surface(s) of the resulting structure to the accompaniment of the formation of isolation regions differing in size or an isolation region having portions differing in size, the increase in the number of steps for the purpose of attaining the mitigation of crystal defects, and the adverse effect of remaining poly-Si on element regions, as opposed to the formation of a trench type isolation region(s).

Further, since an upper portion of the isolation region of the present invention, having a face exposed to the outside of a substrate, is constituted of a silicon nitride region resistant to oxidation, new differences in level between the upper surface of the isolation region and the upper surface of the substrate corresponding to element regions are little liable to appear by various etching treatments effected after the formation of the isolation region for the purpose of producing a semiconductor device.

Accordingly, application of the process of the present invention for forming an isolation region(s) can obviate the aforementioned various problems, and can realize simplification of the process, higher-density integration of a device, an improvement in the reliability of the device, etc.

What is claimed is:

1. A process for forming an isolation region(s) on a substrate made of silicon, which comprises the steps of:
   (A) forming on a substrate a mask made of a first oxide film and having an opening(s) partially exposing the upper surface of said substrate;
   (B) implanting oxygen ion into said substrate by utilizing said mask, and thereafter heat-treating the resulting structure to form a silicon oxide region(s) inside said substrate;
   (C) implanting nitrogen ions into said substrate by utilizing said mask to form a silicon nitride region(s) adjoining the upper face(s) of said silicon oxide region(s) facing the upper surface of said substrate;
   (D) removing said mask; and
   (E) thermally oxidizing an upper substrate region(s) on the upper side of said silicon nitride region(s) to convert said upper substrate region(s) into an oxide film(s) as a second oxide film(s), and thereafter removing said second oxide film(s) positioned on the upper side of said silicon nitride region(s).

2. A process for forming an isolation region(s) as claimed in claim 1, wherein, after the removal of said mask in the step (D), the formation of said second oxide film(s) in the step (E) is done all over the upper surface portion of said substrate, followed by the removal of all the resulting second oxide film positioned on the upper face of the unconverted portion of said substrate.

3. A process for forming an isolation region(s) as claimed in claim 1, wherein, after the removal of said mask in the step (D), the formation of said second oxide film(s) in the step (E) is done all over the upper surface portion of said substrate, followed by removal of the resulting second oxide film only in the area(s) thereof positioned substantially right on the upper face(s) of said silicon nitride region(s) formed in the step (C).

4. A process for forming an isolation region(s) as claimed in claim 1, wherein, after the formation of said silicon nitride region(s) in the step (C), the formation of said second oxide film(s) in the step (E) is done in said upper substrate region(s) only positioned right under said opening(s) of said mask, followed by simultaneous removal of said second oxide film(s) and said mask.

5. A process for forming an isolation region(s) as claimed in claim 1, wherein, after the formation of said silicon nitride region(s) in the step (C), the formation of said second oxide film(s) in the step (E) is done in said upper substrate region(s) only positioned right under said opening(s) of said mask, followed by the removal of all said second oxide film(s) simultaneously with the removal of said mask in the step (D) which is done only partially in the thickness-wise direction of said mask.

6. A process for forming an isolation region(s) as claimed in claim 1, wherein the total thickness of said silicon oxide region(s) and said silicon nitride region(s) is about 4,000 to about 5,000 Å.

7. A process for forming an isolation region(s) on a substrate made of silicon, which comprises the steps of:
   (A) forming on a substrate a mask made of a first oxide film and having an opening(s) partially exposing the upper surface of said substrate;
   (B) implanting oxygen ions into said substrate by utilizing said mask, and thereafter heat-treating the resulting structure to form a silicon oxide region(s) inside said substrate;
   (C) implanting boron ions or phosphorus ions into said substrate by utilizing said mask or a mask made of said first oxide film and a resist to form a channel stop region(s) adjoining the under face(s) of said silicon oxide region(s);
   (D) implanting nitrogen ions into said substrate by utilizing said mask to form a silicon nitride region(s) adjoining the upper face(s) of said oxide region(s) facing the upper surface of said substrate;
   (E) removing said mask; and
   (F) thermally oxidizing an upper substrate region(s) on the upper side of said silicon nitride region(s) to convert said upper substrate region(s) into an oxide film(s) as a second oxide film(s), and thereafter removing said second oxide film(s) positioned on the upper side of said silicon nitride region(s).

8. A process for forming an isolation region(s) as claimed in claim 7, wherein the formation of said silicon nitride region(s) in the step(D) is done after the formation of said channel stop region(s) in the step (C).

9. A process for forming an isolation region(s) as claimed in claim 7, wherein the formation of said channel stop region(s) in the step(C) is done after the formation of said silicon nitride region(s) in the step (D).

10. A process for forming an isolation region(s) as claimed in claim 7, wherein, after the removal of said mask in the step (E), the formation of said second oxide film(s) in the step (F) is done all over the upper surface portion of said substrate, followed by removal of all the resulting second oxide film positioned on the upper face of the unconverted portion of said substrate.

11. A process for forming an isolation region(s) as claimed in claim 7, wherein, after the removal of said mask in the step (E), the formation of said second oxide film(s) in the step (F) is done all over the upper surface portion of said substrate, followed by removal of the resulting second oxide film only in the area(s) thereof positioned substantially right on the upper face(s) of said silicon nitride region(s) formed in the step (D).

12. A process for forming an isolation region(s) as claimed in claim 7, wherein, after the formation of said silicon nitride in the step (D), the formation of said oxide film(s) in the step (F) is done in said upper substrate region(s) only positioned right under said opening(s) of said mask, followed by simultaneous removal of said second oxide film(s) and said mask.

13. A process for forming an isolation region(s) as claimed in claim 7, wherein, after the formation of said silicon nitride in the step (D), the formation of said second oxide film(s) in the step (F) is done in said upper substrate region(s) only positioned right under said opening(s) of said mask, followed by the removal of all said second oxide film(s) simultaneously with the removal of said mask in the step (E) which is done only partially in the thickness-wise direction of said mask.

14. A process for forming an isolation region(s) as claimed in claim 7, wherein the total thickness of said silicon oxide region(s) and said silicon nitride region(s) is about 4,000 to about 5,000 Å.

* * * * *